US009715926B2

(12) United States Patent
Cho

(10) Patent No.: US 9,715,926 B2
(45) Date of Patent: Jul. 25, 2017

(54) MEMRISTIVE DEVICE SWITCHING BY ALTERNATING POLARITY PULSES

(71) Applicant: Hewlett Packard Enterprise Development LP, Houston, TX (US)

(72) Inventor: Hans S. Cho, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/031,853

(22) PCT Filed: Oct. 31, 2013

(86) PCT No.: PCT/US2013/067703
§ 371 (c)(1),
(2) Date: Apr. 25, 2016

(87) PCT Pub. No.: WO2015/065415
PCT Pub. Date: May 7, 2015

(65) Prior Publication Data
US 2016/0267976 A1   Sep. 15, 2016

(51) Int. Cl.
*G11C 11/00* (2006.01)
*G11C 13/00* (2006.01)

(52) U.S. Cl.
CPC ...... *G11C 13/0069* (2013.01); *G11C 13/0007* (2013.01); *G11C 13/0026* (2013.01); *G11C 13/0028* (2013.01); *G11C 2013/0073* (2013.01); *G11C 2013/0092* (2013.01)

(58) Field of Classification Search
CPC ............ G11C 13/0069; G11C 13/0004; G11C 13/0007

USPC ..................... 365/148, 189.09, 171; 257/2, 4
See application file for complete search history.

(56) References Cited

U.S. PATENT DOCUMENTS

| | | |
|---|---|---|
| 2009/0163826 A1 | 6/2009 | Mouttet |
| 2009/0225583 A1* | 9/2009 | Lee ................... G11C 13/0007 365/148 |
| 2011/0186801 A1* | 8/2011 | Yang ....................... H01L 45/00 257/4 |
| 2011/0266513 A1* | 11/2011 | Williams ........... G11C 13/0007 257/4 |
| 2012/0120711 A1 | 5/2012 | Rabkin et al. |
| 2012/0195099 A1 | 8/2012 | Miao et al. |
| 2012/0218810 A1 | 8/2012 | Srinivasan et al. |
| 2012/0243577 A1 | 9/2012 | Zhang et al. |

(Continued)

FOREIGN PATENT DOCUMENTS

WO   WO-2011133139 A1   10/2011

OTHER PUBLICATIONS

Alibart, F. et al., High-precision Tuning of State for Memristive Devices by Adaptable Variation-tolerant Algorithm, Jun. 10, 2011.

(Continued)

*Primary Examiner* — Connie Yoha
(74) *Attorney, Agent, or Firm* — Patent Law Group LLP

(57) ABSTRACT

A method to program a memristive device includes applying a pulse sequence including at least a series of pulses in alternating polarity to set the memristive device. The series has an odd number of pulses where odd numbered pulses have a first electrical polarity that switches the device to the state and even numbered pulse or pulses have a second electrical polarity.

15 Claims, 4 Drawing Sheets

(56) References Cited

U.S. PATENT DOCUMENTS

2013/0094275 A1  4/2013  Chen
2013/0210193 A1  8/2013  Lee et al.
2013/0221314 A1  8/2013  Pramanik et al.

OTHER PUBLICATIONS

International Searching Authority, The International Search Report and the Written Opinion, Aug. 7, 2014, 12 Pages.

* cited by examiner

MEMRISTIVE DEVICE SWITCHING BY ALTERNATING POLARITY PULSES

BACKGROUND

Solid state storage systems are attractive because they are rugged and data persistent without power. One type of solid state memory is a memristive device that displays resistance switching. A memristive device can be set to an "ON" state with a low resistance or reset to an "OFF" state with a high resistance. To program and read the value of a memristive device, corresponding write and read voltages are applied to the device.

BRIEF DESCRIPTION OF THE DRAWINGS

In the drawings.

Use of the same reference numbers in different figures indicates similar or identical elements.

DETAILED DESCRIPTION

Figure 1:
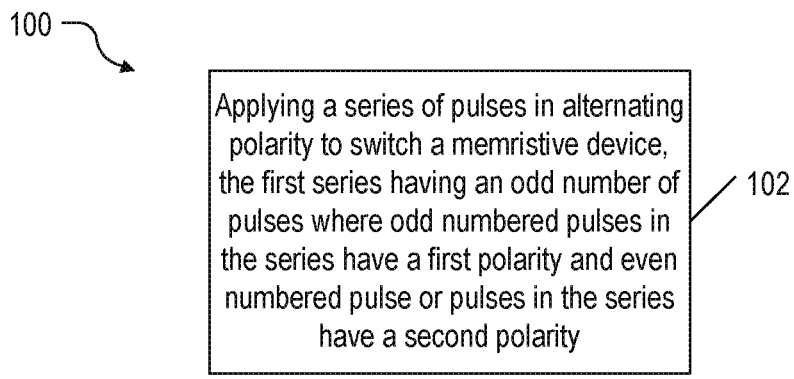
FIG. 1 is a flowchart of a method to switch memristive devices in examples of the present disclosure.

As used herein, the term "includes" means includes but not limited to, the term "including" means including but not limited to. The terms "a" and "an" are intended to denote at least one of a particular element. The term "based on" means based at least in part on.

A memristive device may be based on a metal-insulator-metal (MIM) structure that demonstrates reversible and non-volatile resistance-switching behavior. A memristive device may include a bottom electrode, a switching oxide layer, and atop electrode. The switching oxide layer may be formed from a variety of materials including titanium dioxide ($TiO_2$) or tantalum pentoxide ($Ta_2O_5$) and its sub-oxide variants. The switching oxide layer serves as a matrix with mobile dopants. When a voltage or a current applied across the switching oxide layer exceeds a threshold, the mobile dopants move through the switching oxide layer to a new location and thereby alter the electric resistance of the switching oxide layer. The motion of the dopants may be caused by (1) electrical field-driven drift and (2) resistive heating-driven diffusion.

It may be difficult to control the end-state resistance of a memristive device during ON-switching. Once ON-switching progresses beyond a certain threshold, the memristive device may experience a sudden increase in current flow that in turn increases drift and diffusion, which may further decrease the resistance in a runaway current-resistance feedback loop. This may make it difficult to set the memristive device to an ON state of relatively high resistance (e.g., 0.1 to 10 megaohms). This may also lead to "over-switching" the memristive device to an excessively conductive state. In some cases, the memristive device may be switched to such an extreme low resistance that it is "stuck ON" and cannot be switched back to the low resistance ON state or the high resistance OFF state. Thus what are needed are method and apparatus that mitigate over-switching and maintain the probability of successful ON-switching.

In a switching oxide layer of a memristive device, dopant diffusion from resistive heating occurs regardless of the current flow direction. Therefore flowing current in the opposite direction as the intended direction for switching also heats the switching oxide layer in the device, which keeps the switching oxide layer warm and susceptible to switching. The reverse current may be small so it does not substantially revert the switching in the intended direction. Taking advantage of these principles, examples of the present disclosure applies a series of pulses in alternating polarity to switch the memristive device.

The series has an odd number of total pulses where the odd numbered pulses have a first electrical polarity and the even numbered pulse or pulses have a second electrical polarity. The odd numbered pulses cause current flow in the intended direction of switching, such as the forward direction for ON-switching. The even numbered pulses cause current flow in the reverse direction, which allows resistive heating to occur in absence of forward biasing. This reduces the net drift in the intended direction of switching relative to the total magnitude of current flowing through the memristive device. The final pulse, which is an odd numbered pulse that causes current flow in the intended direction of switching, brings the final state of the memristive device to a desired resistance. The final pulse has smaller pulse height and duration than a single pulse that switches the memristive device with high certainty but non-trivial probability of over-switching the device. Thus the smaller pulse height and shorter duration may mitigate excessive forward bias that results in runaway currents and over-switching of memristive devices.

FIG. 1 is a flowchart of a method 100 to switch memristive devices in examples of the present disclosure. In block 102, a series of pulses in alternating polarity is applied to switch a memristive device. For example, the series is applied to set the memristive device to the ON state. The series has an odd number of total pulses where the odd numbered pulses have a first electrical polarity and the even numbered pulse or pulses have a second electrical polarity. For example, the odd numbered pulses are positive voltages or currents, and the even numbered pulses are negative voltages or currents. The voltages of the pulses may be in the range of 0.2 to 2 volts (V). Pulse durations may be in the range of nanoseconds (ns) up to microseconds (µs), such as 1 ns to 10 µs. The interval between the pulses may be under 10 ns, such as under 5 ns, to take advantage of the resistive heating from the previous pulse and maintaining the heating by applying a reverse bias.

Figure 2:
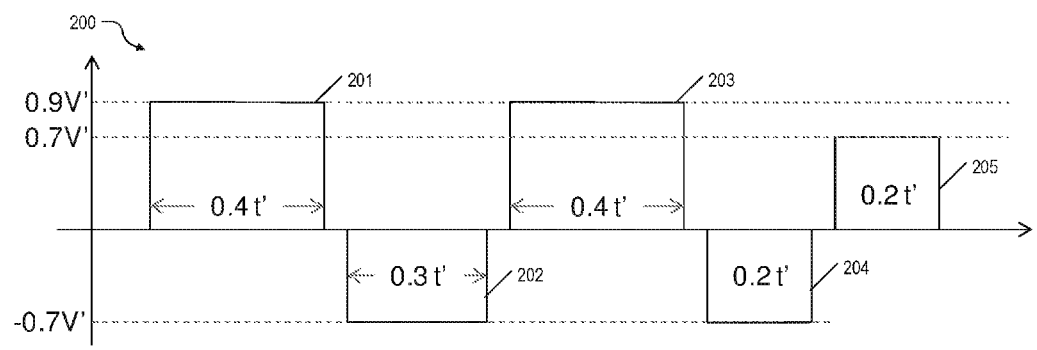
FIGS. 2, 3, and 4 are graph illustrating respective series with an odd number of pulses in alternating polarity that may be applied to switch a memristive device to a first state in examples of the present disclosure.

FIG. 2 is a graph illustrating a series 200 with an odd number of pulses in alternating polarity that may be applied to a memristive device in method 100 (FIG. 1) in examples of the present disclosure. Series 200 includes pulses 201, 202, 203, 204, and 205. The odd numbered pulses 201, 203, and 205 may be positive voltage pulses that cause current flow in the forward direction for ON-switching. The even numbered pulses 202 and 204 may be negative voltage pulses that cause current flow in the reverse direction, which allows resistive heating to keep the oxide switching layer of the memristive device warm and susceptible to switching in absence of forward biasing. The final pulse 205, which is an odd numbered pulse that causes current flow in the forward direction for ON-switching, brings the final state of the memristive device to a desired resistance.

Pulses 201 to 205 have pulse heights and durations defined relative to a pulse height V' and a duration t' of a reference pulse that switches the memristive device with high certainty to the ON state but with a non-trivial probability of over-switching the device (overshoot a resistance value or a range of resistance values). High certainty and non-trivial probability may depend on the fault tolerance of a memory system. High certainty may be greater than 97%. Non-trivial probability may be 2 to 20%. For example, pulse 201 has a pulse height of 0.9V' and a duration of 0.4 t', pulse 202 has a pulse height of 0.7V' and a duration of 0.3 t', pulse 203 has a pulse height of 0.9V' and a duration of 0.4 t', pulse 204 has a pulse height of 0.7V' and a duration of 0.2 t', and pulse 205 has a pulse height of 0.7V' and a duration of 0.2 t'. As described, the final pulse 205 has a pulse height and a duration less than those of the reference pulse. Furthermore, the combined duration of odd numbered pulses 201, 203, and 205 is less than that of the reference pulse, and the combined duration of even numbered pulses 202 and 204 is less than that of the reference pulse. These factors may mitigate excessive forward bias that results in runaway currents and over-switching of the memristive device.

Figure 3:
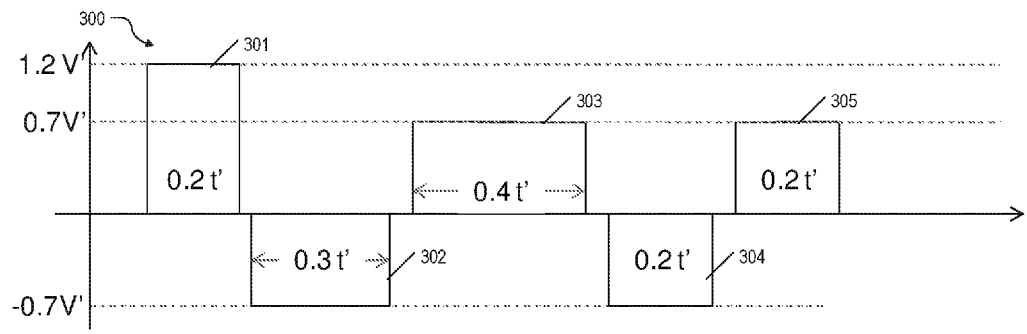

FIG. 3 is a graph illustrating a series 300 with an odd number of pulses in alternating polarity that may be applied to a memristive device in method 100 (FIG. 1) in examples of the present disclosure. Series 300 includes pulses 301, 302, 303, 304, and 305. The odd numbered pulses 301, 303, and 305 may be positive voltage pulses that cause current flow in the forward direction for ON-switching. The even numbered pulses 302 and 304 may be negative voltage pulses that cause current flow in the reverse direction, which allows resistive heating to keep the oxide switching layer of the memristive device warm and susceptible to switching in absence of forward biasing. The final pulse 305, which is an odd numbered pulse that causes current flow in the forward direction for ON-switching, brings the final state of the memristive device to a desired resistance.

Pulses 301 to 305 have pulse heights and durations defined relative to pulse height V' and duration t' of the reference pulse that switches the memristive device with high certainty but with a non-trivial probability of over-switching. For example, pulse 301 has a pulse height of 1.2V' and a duration of 0.2 t', pulse 302 has a pulse height of 0.7V' and a duration of 0.3 t', pulse 203 has a pulse height of 0.7V' and a duration of 0.4 t', pulse 204 has a pulse height of 0.7V' and a duration of 0.2 t', and pulse 205 has a pulse height of 0.7V' and a duration of 0.2 t'.

As described, the final pulse 305 has a pulse height and a duration less than those of the reference pulse. Furthermore, the combined duration of odd numbered pulses 301, 303, and 305 may be greater than that of the reference pulse, and the combined duration of even numbered pulses 302 and 304 may be greater than that of the reference pulse. These factors may mitigate excessive forward bias that results in runaway currents and over-switching of the memristive device.

Figure 4:
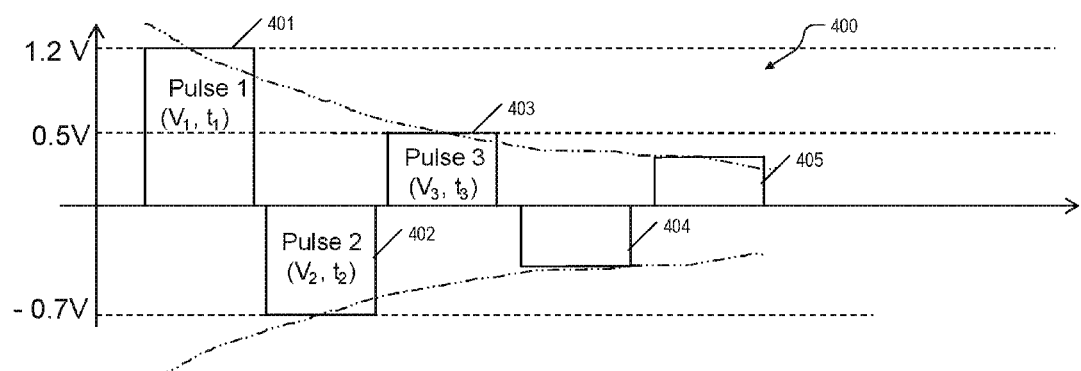

FIG. 4 is a graph illustrating a series 400 with an odd number of pulses in alternating polarity that may be applied to a memristive device in method 100 (FIG. 1) in examples of the present disclosure. Series 400 includes pulses 401, 402, and 403. Series 400 may further include pulses 404 and 405. The odd numbered pulses 401, 403, and 405 may be positive voltage pulses that cause current flow in the forward direction for ON-switching. The even numbered pulses 402 and 404 may be negative voltage pulses that cause current flow in the reverse direction, which allows resistive heating to keep the oxide switching layer of the memristive device warm and susceptible to switching in absence of forward biasing. The final pulse 403 or 405, which is an odd numbered pulse that causes current flow in the forward direction for ON-switching, brings the final state of the memristive device to a desired resistance.

Pulses 401 to 405 have pulse heights and durations defined relative to pulse height V' and duration t' of the reference pulse that switches the memristive device with high certainty but with a non-trivial probability of over-switching. Pulse 401 has a pulse height $V_1$ and a duration $t_1$, pulse 402 has a pulse height and a duration $t_2$, pulse 403 has a pulse height $V_3$ and a duration $t_3$, and so forth. For example, pulse height $V_1$ may be 1.2V, pulse height $V_2$ may be 0.7V, and pulse height $V_3$ may be 0.5V. Duration t1 may be about 25 ns, duration t2 may be around 20 ns, duration t3 may be 15 ns, and so forth.

As described, series 400 has decreasing pulse height where $V_1 \geq V_2 \geq V_3 \geq \ldots$. Assuming current s constant, series 400 has decreasing power dissipation where $|V_1 t_1| > |V_2 t_2| > |V_3 t_3| \ldots$. Furthermore the total power dissipated by positive (odd numbered) voltage pulses is greater than the total power dissipated by negative (even numbered) voltage pulse or pulses. In other words, $\Sigma V_i t_i > 0$. These factors may mitigate excessive forward bias that results in runaway currents and over-switching of the memristive device.

Figure 5:
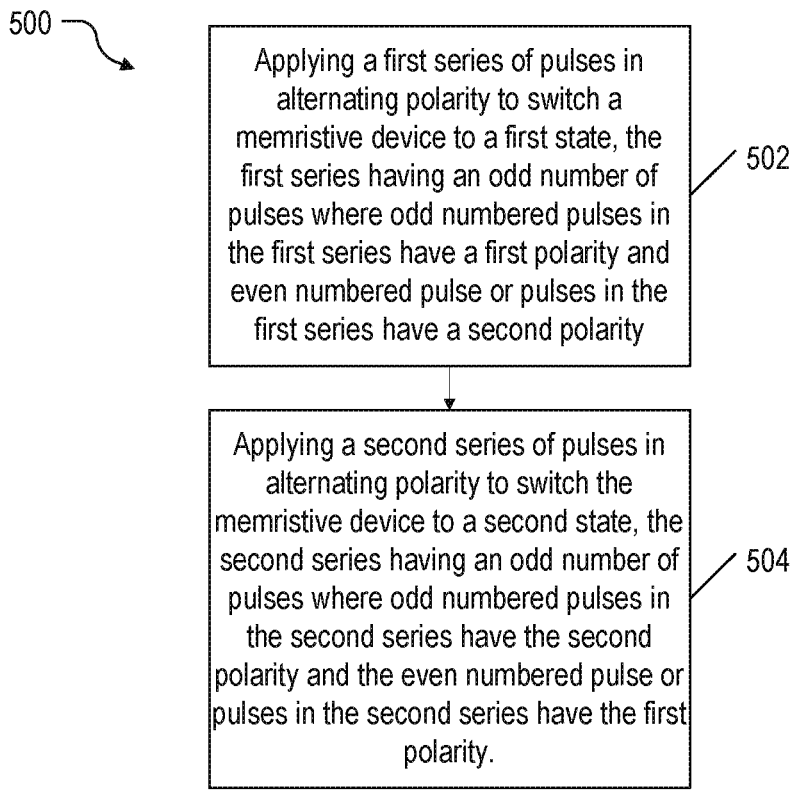
FIG. 5 is a flowchart of a method to switch memristive device in examples of the present disclosure.

FIG. 5 is a flowchart of a method 500 to switch memristive devices in examples of the present disclosure. Method 500 may begin in block 502.

In block 502, a first series of pulses in alternating polarity is applied to switch a memristive device to a first state. For example, the first series is applied to set the memristive device to the ON state. The first series has an odd number of pulses where the odd numbered pulses have a first electrical polarity and the even numbered pulse or pulses have a second electrical polarity. For example, the odd numbered pulses are positive voltages or currents, and the even numbered pulses are negative voltages or currents. The first series may be series 200 (FIG. 2), 300 (FIG. 3), or 400 (FIG. 4) described above. Block 502 may be followed by block 504.

In block 504, a second series of pulses in alternating polarity is applied to switch a memristive device to a second state. For example, the second series is applied to set the memristive device to the OFF state. The second series has an odd number of pulses where the odd numbered pulses have the second electrical polarity and the even numbered pulse or pulses have the first electrical polarity. For example, the odd numbered pulses are negative voltage or current pulses, and the even numbered pulses are negative voltage or current pulses.

Figure 6:
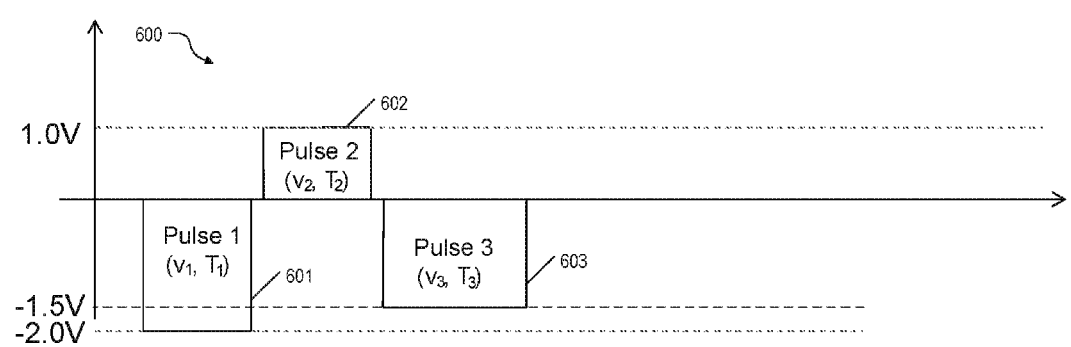
FIG. 6 is a graph illustrating a series with an odd number of pulses in alternating polarity that may be applied to switch a memristive device to a second state in examples of the present disclosure.

FIG. 6 is a graph illustrating a series 600 with an odd number of pulses in alternating polarity that may be applied to a memristive device in block 504 of method 500 (FIG. 5) in examples of the present disclosure. Series 600 includes pulses 601, 602, and 603. The odd numbered pulses 601 and 603 may be negative voltage pulses that cause current flow in the reverse direction for OFF-switching. The even numbered pulse 602 may be a positive voltage pulse that causes current flow in the forward direction for ON-switching.

FIG. 6 shows the first pulse 601 may have the greatest pulse height $v_1$ but the shortest duration $T_1$. The second pulse 602 has a smaller pulse height $v_2$ and shorter or similar duration $T_2$ as first pulse 601 (e.g., within 20%). The final pulse 603 has a pulse height $v_3$ intermediate of pulses 601 and 602 but a duration $T_3$ longer than pulses 601 and 602.

If series 600 includes additional pulses, they would follow the pattern of pulses 602 and 603. For example, pulse height $v_1$ may be 2V, pulse height $v_2$ may be 1V, and pulse height $v_3$ may be 1.5V. Duration $t_1$ may be about 10 ns, duration $t_2$ may be about 10 ns, and duration $t_3$ may be about 20 ns.

The series of alternating polarity pulses described above may be part of a longer pulse sequence. In other words, the series of alternating polarity pulses may be preceded by one or more pulses in either or both electrical polarities. Such one or more preceding pulses may not be significant to the switching affected by the following series of alternating polarity pulses. However, such pulses may be included in the pulse sequence for other purposes such as level-sensing or write circuit control.

Although the series of alternating polarity pulses described above are shown as square waves (e.g., a top-hat pulse shape), they may take other pulse shapes. For example, the pulses may have a sinusoidal, triangular, tapered (e.g., trapezoidal), spiked then leveled (e.g., front-loaded), or asymptotically decaying pulse shape.

Figure 7:
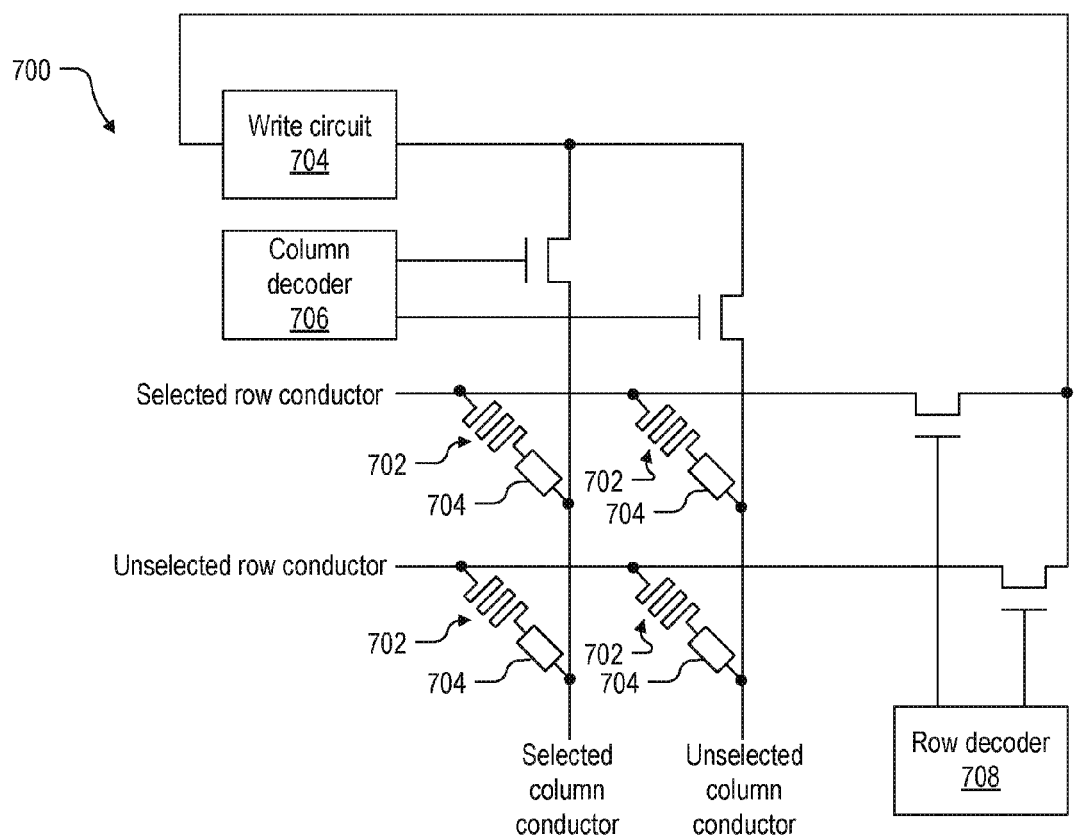
FIG. 7 is a simplified view of a memory array in examples of the present disclosure.

FIG. 7 is a simplified view of a memory array 700 in examples of the present disclosure. Array 700 includes a memristive device 702 located at each cross-point of column and row conductors. A write circuit 704 provides write signals to a memristive device 702 selected by a column decoder 706 and row decoder 708. The write signal may set the selected memristive device 702 to an ON state or an OFF state. The write signal may be one of series 200 (FIG. 2), 300 (FIG. 3), 400 (FIG. 4), and 600 (FIG. 6) described above. Array 700 may include a selector 704 coupled in series with memristive device 704 to limit "sneak" current. Selector 704 may be a bidirectional negative differential resistance (NDR) element that does not turn on until a positive or negative threshold voltage is reached.

Various other adaptations and combinations of features of the examples disclosed are within the scope of the invention.

What is claimed is:

1. A method to program a memristive device, comprising:
applying a pulse sequence including at least a series of pulses in alternating polarity to switch the memristive device to a state, the series comprising an odd number of total pulses wherein odd numbered pulses in the series comprise a first electrical polarity that switches the memristive device to the state, even numbered pulse or pulses in the series comprise a second electrical polarity and a final odd numbered pulse brings the state of the memristive device to a desired resistance.

2. The method of claim 1, wherein the final pulse in the series have a pulse height and a duration less than a reference pulse that sets the memristive device with high certainty and a non-trivial probability of over-switching the memristive device.

3. The method of claim 1, wherein the series has decreasing pulse height.

4. The method of claim 3, wherein the series has decreasing power dissipation.

5. The method of claim 4, wherein the odd numbered pulses has greater power dissipation than the even numbered pulse or pulses.

6. The method of claim 1, further comprising:
applying another pulse sequence including at least another series of pulses in alternating polarity to switch the memristive device to another state, the other series comprising another odd number of pulses wherein odd numbered pulses in the other series comprise the second electrical polarity that switches the memristive device to the other state and the even numbered pulse or pulses in the other series comprise the first electrical polarity.

7. The method of claim 6, wherein a first pulse in the other series has a greater pulse height than a second pulse in the other series.

8. The method of claim 7, wherein the first pulse and the second pulse in the other series have a substantially same duration.

9. The method of claim 8, wherein a third pulse in the other series has a pulse height intermediate of pulse heights of first and second pulses in the other series, and the third pulse in the other series has a longer duration than first and second pulses in the other series.

10. The method of claim 1, wherein the pulses have a top-hat, sinusoidal, triangular, tapered, spiked then leveled, or asymptotically decaying pulse shape.

11. A memory array, comprising:
memristive devices connected at intersection of column and row conductors;
column and row decoders for selecting a memristive device; and
a write circuit to apply a write signal to the selected memristive device, the write signal comprising a pulse sequence including at least a series of pulses in alternating polarity to switch the memristive device to a state, the series comprising an odd number of total pulses wherein odd numbered pulses in the series comprise a first electrical polarity that switches the memristive device to the state, even numbered pulse or pulses in the series comprise a second electrical polarity and a final odd numbered pulse brings the state of the memristive device to a desired resistance.

12. The memory array of claim 11, wherein the final pulse in the series have a pulse height and a duration less than a reference pulse that sets the memristive device with high certainty and a non-trivial probability of over-switching the memristive device.

13. The memory array of claim 11, wherein the series has decreasing pulse height, and the series has decreasing power dissipation.

14. The memory array of claim 11, wherein the write circuit is to further apply another pulse sequence including at least another series of pulses in alternating polarity to switch the memristive device to another state, the other series comprising another odd number of pulses wherein odd numbered pulses in the other series comprise the second electrical polarity that switches the memristive device to the other state and the even numbered pulse or pulses in the other series comprise the first electrical polarity.

15. The memory array of claim 11, wherein the pulses have a top-hat, sinusoidal, triangular, tapered, spiked then leveled, or asymptotically decaying pulse shape.

* * * * *